United States Patent [19]

Banik

[11] Patent Number: 5,508,648
[45] Date of Patent: Apr. 16, 1996

[54] DIFFERENTIAL LATCH CIRCUIT

[75] Inventor: Jashojiban Banik, Aloha, Oreg.

[73] Assignee: Intel Corporation, Santa Clara, Calif.

[21] Appl. No.: 283,643

[22] Filed: Aug. 1, 1994

[51] Int. Cl.[6] .................................................. H03K 3/356
[52] U.S. Cl. ........................... 327/203; 327/212; 327/219
[58] Field of Search .................................. 327/202, 203,
327/208, 210, 211, 212, 218, 215, 219;
326/95

[56] References Cited

U.S. PATENT DOCUMENTS

| 4,209,715 | 6/1980 | Aoki | 327/218 |
|---|---|---|---|
| 4,939,384 | 7/1990 | Shikata et al. | 327/218 |
| 5,025,174 | 6/1991 | Shikata | 327/202 |
| 5,032,741 | 7/1991 | Smith | 327/203 |
| 5,105,100 | 4/1992 | Yamada | 327/202 |
| 5,140,179 | 8/1992 | Takano | 327/203 |
| 5,173,870 | 12/1992 | Sukashita et al. | 327/215 |
| 5,216,295 | 6/1993 | Hoang | 327/203 |
| 5,239,206 | 8/1993 | Yanai | 327/202 |
| 5,281,865 | 1/1994 | Yamashita et al. | 327/202 |

Primary Examiner—Timothy P. Callahan
Assistant Examiner—My-Trang Nu Ton
Attorney, Agent, or Firm—Blakely, Sokoloff, Taylor & Zafman

[57] ABSTRACT

A differential latch circuit which places very little capacitance on the clock line is described. The invented differential latch circuit utilizes differential data signals, and thus, has two data lines. The transfer portion of the latch receives the differential data signals and passes them to the storage portion responsive to a control signal. The storage portion stores and outputs the differential data signals. In a first embodiment, each data line in the transfer portion comprises a single transistor pass gate for selectively passing one of the differential data signals responsive to the control signal, which is coupled to the gate terminals of both pass gates.

12 Claims, 8 Drawing Sheets

DIFFERENTIAL LATCH CIRCUIT

BACKGROUND OF THE INVENTION

1. Field of the Invention

This invention relates to the field of digital circuitry, particularly to area of master-slave flip-flops. More specifically, the present invention relates to the area of data latches.

2. Description of the Related Art

The performance of microprocessors and other synchronous devices has been limited by the power dissipation of these devices. It has been observed that a significant amount of power dissipation is generated by the clock line. Therefore, a reduction in the power dissipation of the clock line may greatly decrease the power dissipation of a device. The power dissipation of the clock line may be calculated by the following equation:

$$\text{power dissipation} = \text{capacitance} \times \text{frequency} \times \text{voltage}^2$$

As can be seen from this equation, a decrease in the capacitance on the clock line will decrease the power dissipation of the clock line.

In addition, the frequency at which microprocessors and other synchronous devices are able to operate has been limited by clock skew. Clock skew is the degree to which clock pulses throughout a synchronous device are out of synchronization. The greater the frequency of the clock, the smaller the clock skew must be kept to maintain synchronization of the device. It has been observed that clock skew decreases as capacitance on the clock line is decreased. Thus, reducing capacitance on the clock line may allow microprocessors and other large synchronous circuits to operate at higher clock frequencies.

Capacitance on the clock line is generated in part by master-slave flip-flops. A master-slave flip-flop is composed of two data latches, referred to as the master latch and the slave latch, which are both connected to the clock line. There are many well known circuits for providing master-slave flip-flops. A first prior art method, having a low capacitance on the clock line, is shown in FIG. 8. However, this prior art method suffers from several problems. One such problem is the loss of data due to glitches in the clock signal caused by coupling. For example, while the clock signal asserted on clock line 830 is high and storage portion 870 is storing a high data signal, glitches in the clock signal will temporarily open p-channel transistor 845 and discharge node 875. As a result, the data signal stored in storage portion 870 is lost. Another such problem is the poor passage of data signals asserted on data line 835 due to the use of single transistors for pass gate 840 and pass gate 850. For example, the data signal asserted on data line 835 is passed by pass gate 840, which is composed of single p-channel transistor 845. However, p-channel transistors pass Vcc well, but pass Vss poorly. This limits the speed and the reliability of this flip-flop severely. Finally, contention is experienced when the values stored in storage portion 870 and storage portion 880 differ from the data signals being passed by pass gate 840 and pass gate 850, respectively. Due to these problems, this prior art method is not acceptable for most applications.

A second prior art method that overcomes the aforementioned problems experienced by the first prior art method is shown in FIG. 9. With reference to FIG. 9, master-slave flip-flop 900 comprises master latch 910 and slave latch 920. To suppress glitches experienced by the first prior art method, inverter 960 is added to clock line 930. In addition, to properly pass the data signals asserted on data line 935, pass gate 840 and pass gate 850 are replaced with complimentary pass gate 940 and complimentary pass gate 945, respectively, which pass both Vcc and Vss well. However, because complimentary pass gate 940 and complimentary pass gate 945 contain complimentary devices, inverter 965 is also added to clock line 930 to supply the appropriate clock signal. Finally, to reduce contention which results when the data signal being asserted differs from the signals stored in storage portion 970 and storage portion 980, a tri-state inverter or a pass gate, such as pass gate 975 and pass gate 985, is included.

Although this second prior art method solves the problems with the first prior art method, the large number of transistors and complex routing utilized by this second prior an method result in an excessive amount of capacitance on clock line 930. As a result, the use of this second method in microprocessors and other synchronous circuits results in excessive clock skew and unnecessary power dissipation on the clock line.

SUMMARY OF THE INVENTION

A differential latch circuit which places very little capacitance on the clock line is described. The invented differential latch circuit utilizes differential data signals, and thus, has two data lines. The transfer portion of the latch receives the differential data signals and passes them to the storage portion responsive to a control signal. The storage portion stores and outputs the differential data signals.

In a first and second embodiment, each data line in the transfer portion comprises a single transistor pass gate for selectively passing one of the differential data signals responsive to the control signal, which is coupled to the gate terminals of both pass gates. In a third and fourth embodiment, each data line is coupled to the gate terminal of a single transistor pass gate, whose first terminal is coupled to a voltage. The second terminal of each of these pass gates is coupled to the first terminal of another single transistor pass gate, whose second terminal is coupled to an input of the storage portion and whose gate terminal is coupled to the control signal. Finally, in a fifth and sixth embodiment, each data line is coupled to the gate terminal of a single transistor pass gate, whose first terminal is coupled to an input of the storage portion. The second terminal of both these pass gates is coupled to the first terminal of another single transistor pass gate, whose second terminal is coupled to a voltage and whose gate terminal is coupled to a control signal.

These and other aspects of the present invention will be better described with reference to the Detailed Description of the Preferred Embodiment and the accompanying Figures.

Figure 1:
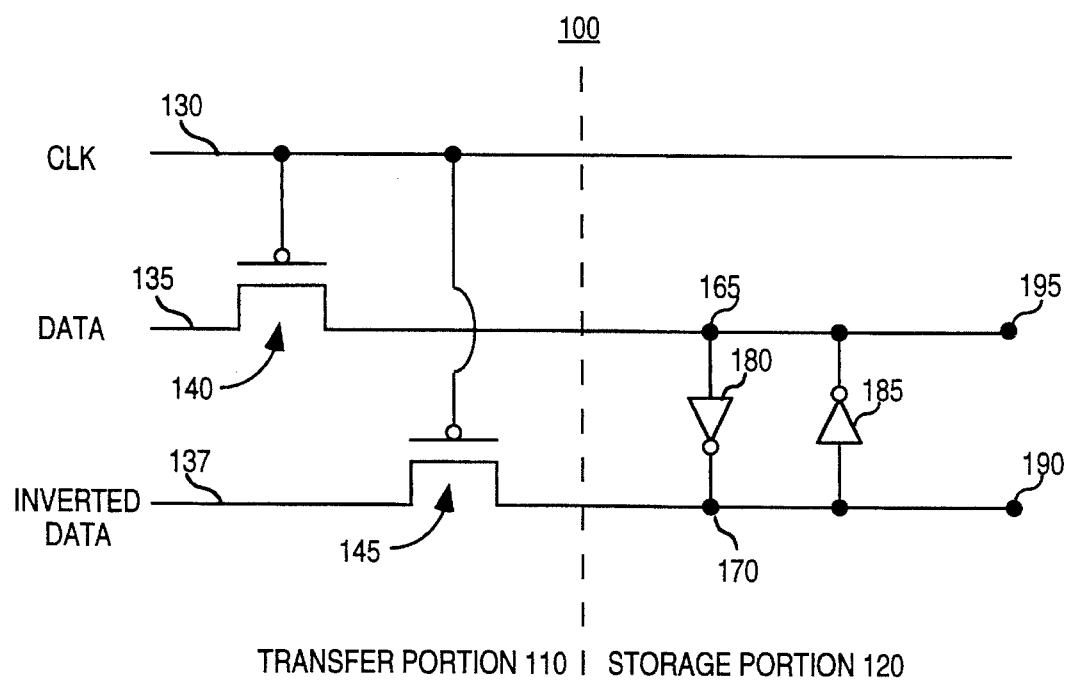
FIG. 1 is a schematic diagram of a first embodiment of a differential latch according to the present invention.
Figure 3:
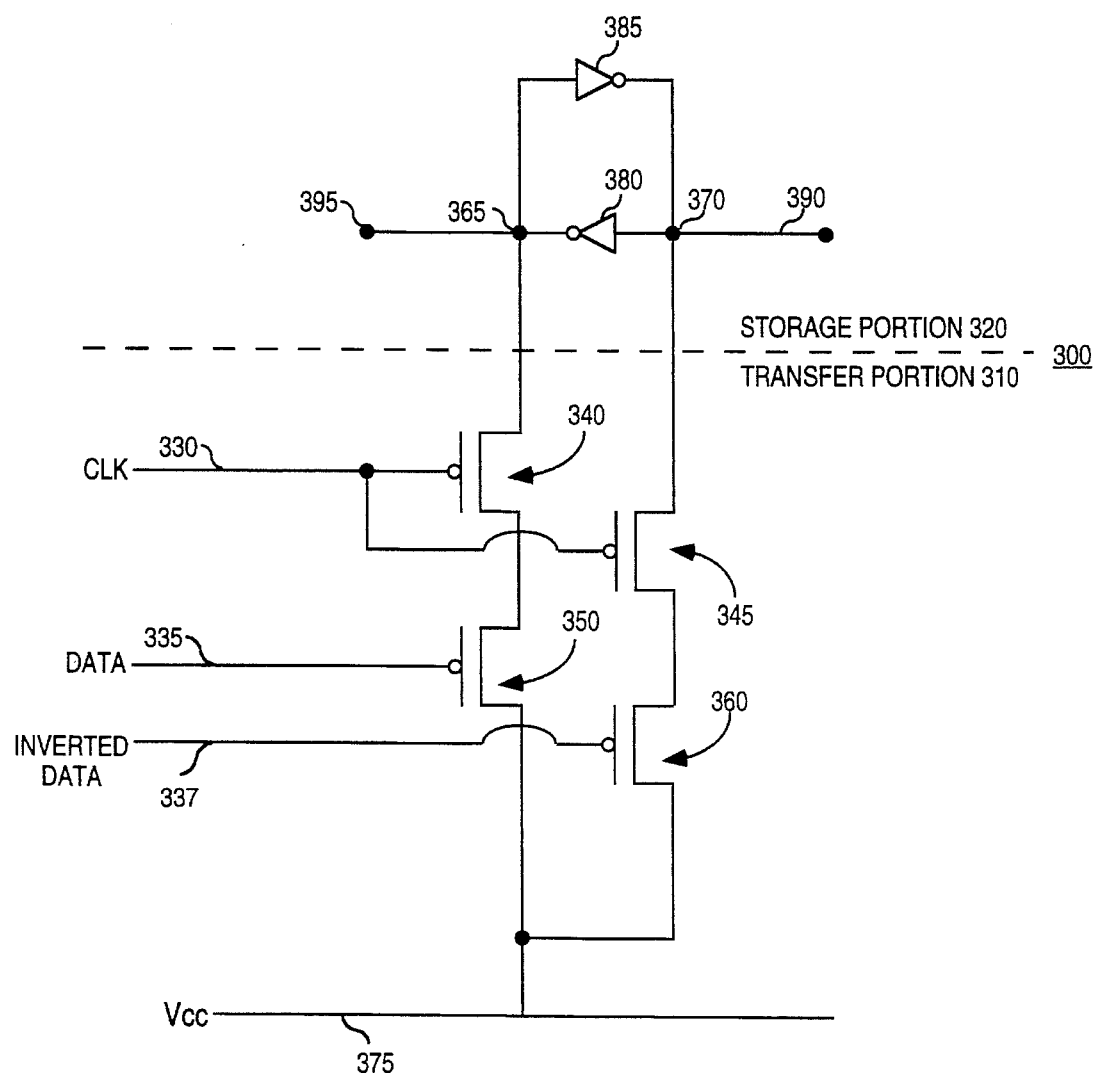
FIG. 3 is a schematic diagram of a third embodiment of a differential latch according to the present invention.

For ease of reference, it might be pointed out that reference numerals in all of the accompanying drawings typically are in the form "drawing number" followed by two digits, xx; for example, reference numerals on FIG. 1 may be numbered 1xx; on FIG. 3, reference numerals maybe numbered 3xx. In certain cases, a reference numeral may be introduced on one drawing and the same reference numeral maybe utilized on other drawings to refer to the same item.

DETAILED DESCRIPTION OF THE PREFERRED EMBODIMENT

What is described herein is a differential latch circuit which places very little capacitance on the clock line, and thus may be used in master-slave flip-flops to reduce clock skew and power dissipation. In the following description, numerous specific details are set forth to provide a thorough understanding of the present invention. It will be apparent, however, to one skilled in the an that the present invention may be practiced without these specific details. In other instances, well known circuits, structures and techniques have not been shown in detail in order not to unnecessarily obscure the present invention.

Highlight of the Present Invention

The invented differential latch utilizes differential data signals. The term differential data signals is used herein to refer to a data signal and an inversion of that data signal. For example, if the data signal is high (Vcc), the inverted data signal is low (Vss), and vice versa. As a result, the invented differential latch receives both Vcc and Vss each time data is received by the latch.

The use of differential data signals results in a latch sufficiently immune form glitches such that glitch suppression circuitry is not needed on the clock line. In addition, the use of differential data signals allows for the strong passage of data signals using single transistor pass gates of the same transistor type. Furthermore, the use of differential data signals sufficiently reduces contention in the storage portion such that circuitry, such as a tri-state inverter or pass gate terminal, is not needed in the storage portion of the invented differential latch. Finally, because of the reduction in the number of devices, the wiring necessary for the clock line of this latch is reduced. Thus, the invented differential latch circuit places very little capacitance on the clock line.

It is worthwhile to note, that the terminals of a transistor are referred to herein as first terminal, second terminal, and gate terminal.

A First Embodiment of Differential Latch

A first embodiment of a differential latch will be described with reference to FIG. 1. This first embodiment works well as the master-latch of a master-slave flip-flop. As shown in FIG. 1, latch 100 may be divided into transfer portion 110 and storage portion 120. Transfer portion 110 is for providing the differential data signals to storage portion 120 when the clock signal is low. Storage portion 120 is for storing the differential data signals it receives from transfer portion 110.

Transfer portion 110 includes clock line 130, data line 135, inverted data line 137, p-channel transistor 140, and p-channel transistor 145. Data line 135 is coupled to the first terminal of p-channel transistor 140, and inverted data line 137 is coupled to the first terminal of p-channel transistor 145. Clock line 130 is coupled to the gate terminal of both p-channel transistor 140 and p-channel transistor 145. The second terminal of both p-channel transistor 140 and p-channel transistor 145 is coupled to storage input 165 and storage input 170, respectively.

Storage portion 120 comprises storage input 165, storage input 170, inverter 180, inverter 185, storage output 190, and storage output 195. Both the input of inverter 180 and the output of inverter 185 are coupled to storage input 165, and both output of inverter 180 and the input of inverter 185 are coupled to storage input 170. Thus, inverter 180 and inverter 185 are in a back-to-back configuration. Storage output 190 and storage output 195 are coupled to the output of inverter 180 and the output of inverter 185, respectively, for providing differential outputs from latch 100.

A data signal is provided on data line 135 to the first terminal of p-channel transistor 140, and an inverted data signal is provided on inverted data line 137 to the first terminal of p-channel transistor 145. The inverted data signal may be provided by an inverter whose input is coupled to data line 135 and whose output is coupled to inverted data line 137. A control signal, such as a clock, is provided on clock line 130 to the gate terminal of both p-channel transistor 140 and p-channel transistor 145. When the clock signal is low, both p-channel transistor 140 and p-channel transistor 145 are turned on. Conversely, when the clock signal is high, both p-channel transistor 140 and p-channel transistor 145 are turned off. The clock signal thus selects when the data signal and the inverted data signal are passed to storage portion 120. The back-to-back configuration of inverter 180 and inverter 185 stores the data signal and the inverted data signal which are passed to storage portion 120. Finally, storage output 190 and storage output 195 provide the inverted data signal and tile data signal, respectively, stored in storage portion 120.

Having described this first embodiment, this discussion will now focus on why this embodiment places very little capacitance on clock line 130. Latch 100 is immunized from glitches in the clock signal asserted on clock line 130 because both storage input 165 and storage input 170 would have to be flipped for data to be lost. Such a process is sufficiently difficult to immunize latch 100 from such glitches without the use of additional circuitry on the clock line.

In addition, latch 100 properly passes the asserted data signals by utilizing two pass gates: p-channel transistor 140 for receiving the data signal and p-channel transistor 145 for receiving the inverted data signal. P-channel transistors pass Vcc well. Thus, by applying differential data signals, it is ensured that either p-channel transistor 140 or p-channel transistor 145 will receive and pass a strong Vcc signal to storage portion 120. As a result, latch 100 properly passes the asserted data signals without the use of additional circuitry on the clock line.

Additionally, latch 100 sufficiently reduces contention in storage portion 120 by driving storage portion 120 from two sides. For example, if the output of inverter 180 is Vcc and the inverted data signal being asserted is Vss, there will be contention between these two signals. However, this contention is reduced because the input of inverter 180 is being simultaneously driven by the data signal asserting Vcc, thereby weakening the output of inverter 180. The same will hold true for inverter 185. The resulting reduction in contention is sufficient to alleviate the need for additional circuitry on the clock line to reduce contention.

In this manner, a latch is provided which places very few devices on the clock line and which requires very little wiring for the clock line. Thus, latch 100 places very little capacitance on the clock line.

An additional advantage of the present invention is that latch 100 provides complimentary outputs without the use of an additional inverter.

A Second Embodiment of a Differential Latch

Figure 2:
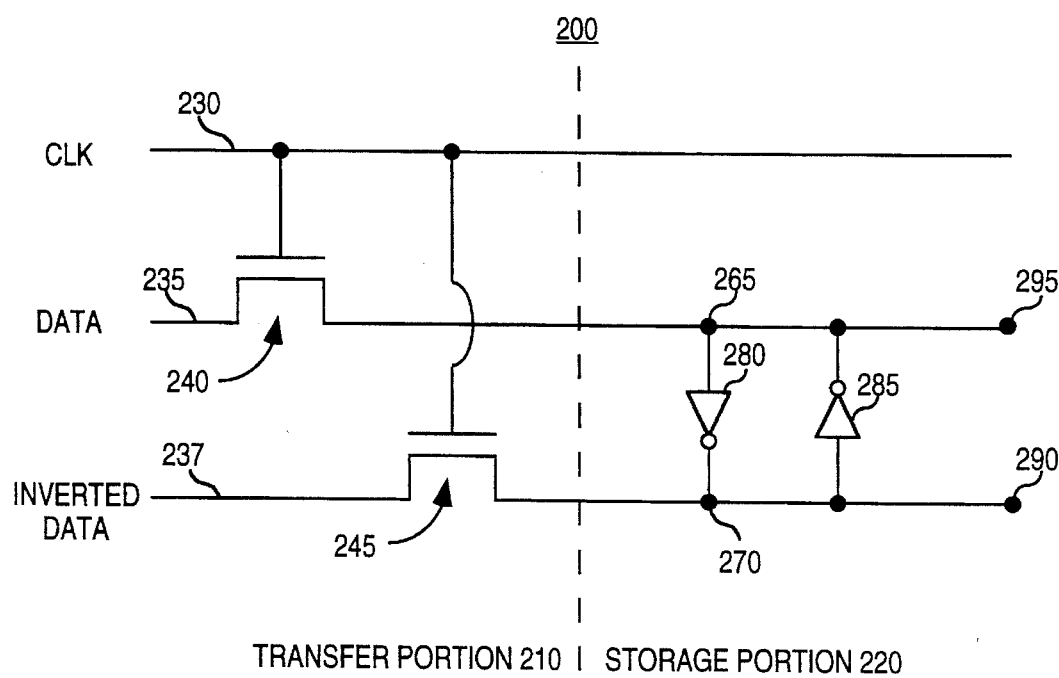
FIG. 2 is a schematic diagram of a second embodiment of a differential latch according to the present invention.

A second embodiment of a differential latch will be described with reference to FIG. 2. This second embodiment functions well as the slave latch of a master-slave flip-flop.

Latch 200 is essentially the same as latch 100 previously described, except n-channel transistor 240 and n-channel transistor 245 are provided in place of p-channel transistor 140 and p-channel transistor 145, respectively. Thus, transfer portion 210 provides the differential data signals to storage portion 220 when the clock signal asserted on clock line 230 is high. In addition, because n-channel transistors pass Vss well rather than Vcc, the use of differential data signals ensures a strong Vss signal will be passed to storage portion 220.

If the first and second embodiments are used as the master and slave latch, respectively, in a master-slave flip-flop, storage output 195 and storage output 190 should be coupled to data line 235 and inverted data line 237, respectively, via buffers.

A Third Embodiment of a Differential Latch

A third embodiment of a differential latch will be described with reference to FIG. 3. This third embodiment works well as the master portion of a master-slave flip-flop. As with latch 100, latch 300 has a transfer portion 310 and storage portion 320 as shown in FIG. 3.

Transfer portion 310 includes clock line 330, data line 335, inverted data line 337, p-channel transistor 340, p-channel transistor 345, p-channel transistor 350, p-channel transistor 360, and power supply voltage 375. Clock line 330 is coupled to the gate terminal of both p-channel transistor 340 and p-channel transistor 345. Data line 335 is coupled to the gate terminal of p-channel transistor 350, and inverted data line 335 is coupled to the gate terminal of p-channel transistor 360. The first terminal of p-channel transistor 340 is coupled to storage input 365; the second terminal of p-channel transistor 340 is coupled to the first tern-final of p-channel transistor 350; and the second terminal of p-channel transistor 350 is coupled to power supply voltage 375. The first terminal of p-channel transistor 345 is coupled to storage input 370; the second terminal of p-channel transistor 345 is coupled to the first terminal of p-channel transistor 360; and the second terminal of p-channel transistor 360 is coupled to power supply voltage 375.

Storage portion 320 comprises storage input 365, storage input 370, inverter 380, inverter 385, storage output 390, and storage output 395. Both the input of inverter 380 and the output of inverter 385 are coupled to storage input 365, and both the output of inverter 380 and the input of inverter 385 are coupled to storage input 370. Thus, inverter 380 and inverter 385 are in a back-to-back configuration. Storage output 390 and storage output 395 are coupled to the output of inverter 380 and the output of inverter 385, respectively, for providing differential outputs from latch 300.

A data signal is provided on data line 335 to the gate terminal of p-channel transistor 350, and an inverted data signal is provided on inverted data line 337 to the gate terminal of p-channel transistor 360. The inverted data signal may be provided by an inverter whose input is coupled to data line 335 and whose output is coupled to inverted data line 337. When the data signal is low and the inverted data signal is high, p-channel transistor 350 is on and p-channel transistor 360 is off. Conversely, when the data signal is high and the inverted data signal is low, p-channel transistor 350 is off and p-channel transistor 360 is on. Additionally, a control signal, such as a clock, is provided on clock line 330 to the gate terminal of both p-channel transistor 340 and p-channel transistor 345. When the clock signal is low, both p-channel transistor 340 and p-channel transistor 345 are turned on. Conversely, when the clock signal is high, both p-channel transistor 340 and p-channel transistor 345 are turned off. In this manner, the clock signal and the data signals select when either storage input 365 or storage input 370 is connected to power supply voltage 375. When storage input 365 is connected to power supply voltage 375, the input to inverter 380 is pulled up. Conversely, when storage input 370 is connected to power supply voltage 375, the input to inverter 385 is pulled up. In this manner, the storage portion indirectly receives the data signal or the inverted data signal storing them in the back-to-back configuration of inverter 385 and inverter 380. Finally, storage output 390 and storage output 395 provide the data signal and the inverted data signal, respectively.

Having described this third embodiment, this discussion will now focus on why this embodiment places very little capacitance on clock line 330.

In addition, latch 300 properly passes the asserted data signals by utilizing single transistor pass gates: p-channel transistor 340 for receiving the data signal; p-channel transistor 345 for receiving the inverted data signal; and both p-channel transistor 340 and p-channel transistor 345 for receiving the clock signal. P-channel pass Vcc well. Thus, by applying differential data signals and tying the pass gates to power supply voltage 375, it is ensured that either p-channel transistor 350 and p-channel transistor 340 or p-channel transistor 360 and p-channel transistor 345 will receive and pass a strong Vcc signal to storage portion 320. As a result, latch 300 properly passes the asserted data signals without the use of additional circuitry on the clock line.

In this manner, a latch is provided which places very few devices on the clock line and which requires very little wiring for the clock line. Thus, latch 300 places very little capacitance on the clock line. The problem of contention still remains in storage portion 320, but it may be resolved using any number of methods, including those which were previously described.

An additional advantage of the present invention is that latch 300 provides complimentary outputs without the use of an additional inverter.

A Fourth Embodiment of A Differential Latch

Figure 4:
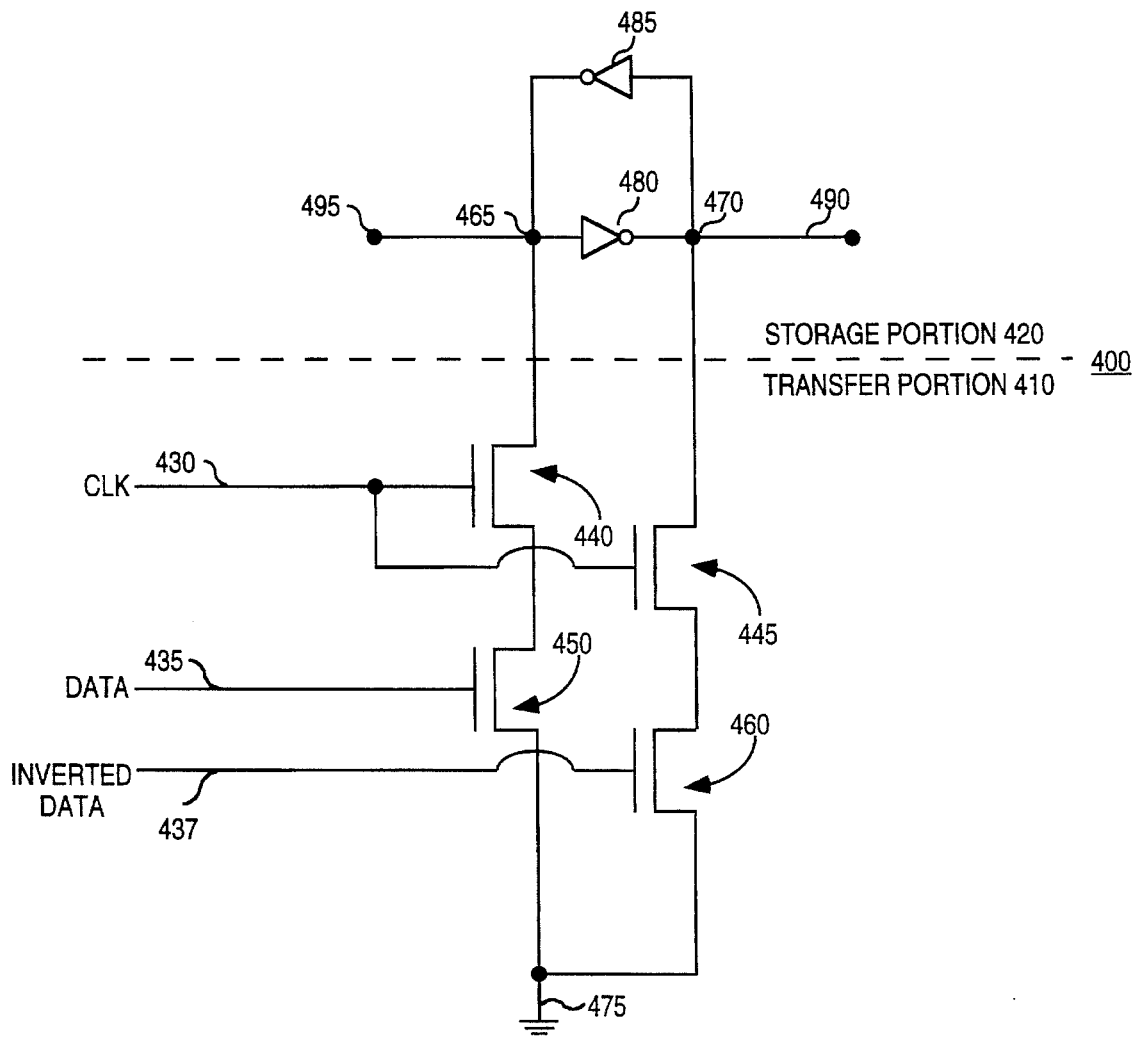
FIG. 4 is a schematic diagram of a fourth embodiment of a differential latch according to the present invention.

A fourth embodiment of a differential latch will be described with reference to FIG. 4. This fourth embodiment works well as the slave portion of a master-slave flip-flop. Latch 400 is essentially the same as latch 300 previously described with certain logic inversions as described below.

In the case of latch 400, n-channel transistor 440, n-channel transistor 445, n-channel transistor 450, and n-channel transistor 460 are provided in place of p-channel transistor 340, p-channel transistor 345, p-channel transistor 350, and p-channel transistor 360, respectively. In addition, power supply voltage 375 is replaced with ground 475. Thus, when the data signal is low and the inverted data signal is high, n-channel transistor 450 is off and n-channel transistor 460 is on. Conversely, when the data signal is high and the inverted data signal is low, n-channel transistor 450 is on and n-channel transistor 460 is off. Additionally, when the clock signal is low, both n-channel transistor 440 and n-channel transistor 445 are turned off. Conversely, when the clock signal is high, both n-channel transistor 440 and n-channel transistor 445 are turned on. In this manner, the clock signal and the data signals select when either storage input 465 or storage input 470 is connected to ground 475. When storage input 465 is connected to ground 475, the input to inverter 480 is pulled down. Conversely, when storage input 470 is connected to ground 475, the input to inverter 485 is pulled down. In this manner, the storage portion indirectly receives the data signal or the inverted data signal storing them in the back-to-back configuration of inverter 485 and inverter 480. Finally, storage output 490 and storage output 495 provide the data signal and the inverted data signal, respectively.

Finally, latch 400 properly passes the asserted data signals because n-channel transistors pass Vss well. Thus, the use of differential data signals ensures the passage of a strong Vss signal to storage portion 420, rather than the strong Vcc signal passed in latch 300.

Although contention remains in the storage portion of latch 400, n-channel transistors are faster than p-channel transistors of a similar size. As a result, contention is lower in this fourth embodiment as compared to the third embodiment.

A Fifth Embodiment of a Differential Latch

Figure 5:
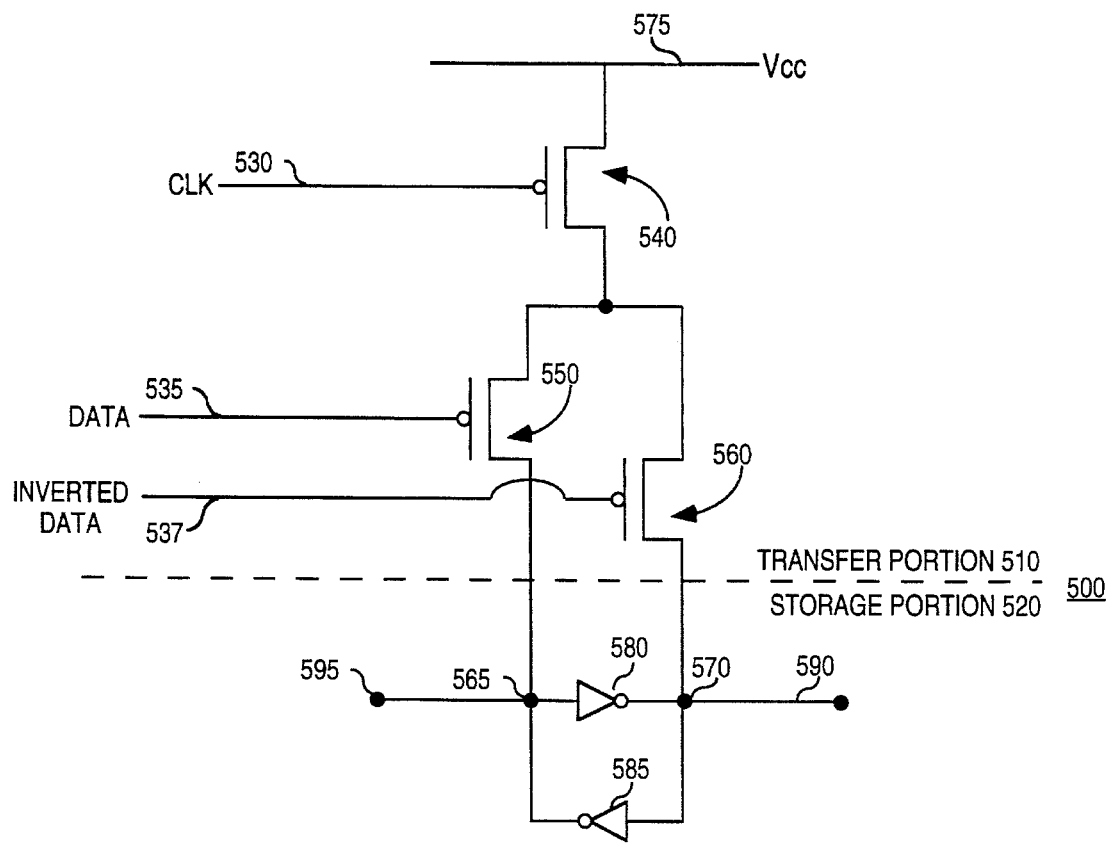
FIG. 5 is a schematic diagram of a fifth embodiment of a differential latch according to the present invention.

A fifth embodiment of a differential latch will be described with reference to FIG. 5. This fifth embodiment works well as the master latch of a master-slave flip-flop. As with latch 100, latch 500 has a transfer portion 510 and a storage portion 520 as shown in FIG. 5.

Transfer portion 510 includes clock line 530, data line 535, inverted data line 537, p-channel transistor 540, p-channel transistor 550, p-channel transistor 560, and power supply voltage 575. Data line 535 is coupled to the gate terminal of p-channel transistor 550, and inverted data line 537 is coupled to the gate terminal of p-channel transistor 560. Clock line 530 is coupled to the gate terminal of p-channel transistor 540. The first terminals of p-channel transistor 550 and p-channel transistor 560 are coupled to storage input 565 and storage input 570, respectively. The second terminals of both p-channel transistor 550 and p-channel transistor 560 are coupled to the first terminal of p-channel transistor 540, while the second terminal of p-channel transistor 540 is coupled to power supply voltage 575. Storage portion 520 is identical to storage portion 320.

A data signal is provided on data line 535 to the gate terminal of p-channel transistor 550, and inverted data signal is provided on inverted data line 537 to the gate terminal of p-channel transistor 560. The inverted data signal may be provided by an inverter whose input is coupled to data line 535 and whose output is coupled to inverted data line 537. When the data signal is low and the inverted data signal is high, p-channel transistor 550 is on and p-channel transistor 560 is off. Conversely when the data signal is high and the inverted data signal is low, p-channel transistor 550 is off and p-channel transistor 560 is on. Additionally, a control signal, such as a clock, is provided on clock line 530 to the gate terminal of p-channel transistor 540. When the clock signal is low, p-channel transistor 540 is turned on. Conversely when the clock signal is high, p-channel transistor 540 is turned off. In this manner, the clock signal and the data signals select when either storage input 565 or storage input 570 is connected to power supply voltage 575. When storage input 565 is connected to power supply voltage 575, the input to inverter 580 is pulled tip. Conversely, when storage input 570 is connected to power supply voltage 575, the input to inverter 585 is pulled up. Thus, storage portion 520 indirectly receives the data signal and the inverted data signal. In addition, storage portion 520 stores and provides the data signal and the inverted data signal as previously described with reference to latch 300.

Finally, latch 500 reduces capacitance on clock line 130 as previously described with reference to latch 300.

A Sixth Embodiment of A Differential Latch

Figure 6:
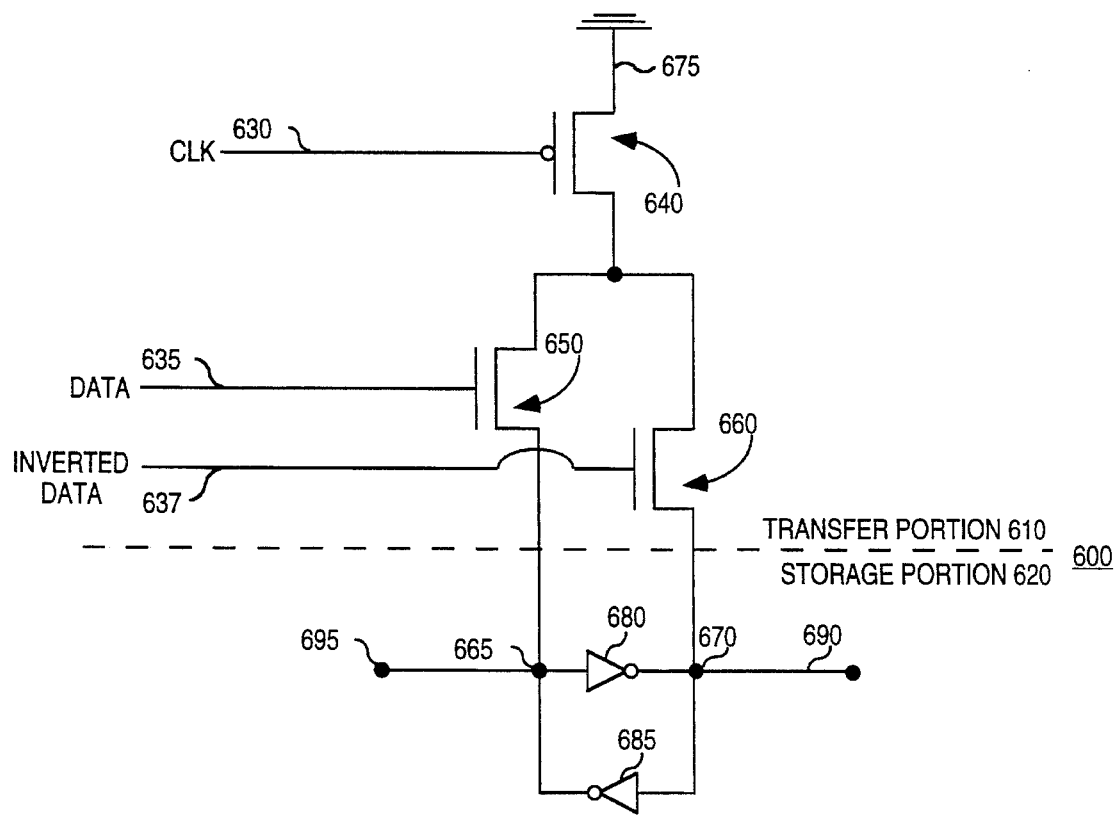
FIG. 6 is a schematic diagram of a sixth embodiment of a differential latch according to the present invention.

A sixth embodiment of a differential latch will be described with reference to FIG. 6. This sixth embodiment works well as the slave portion of a master-slave flip-flop. Latch 600 is essentially the same as latch 500 previously described with certain logic inversions as described below.

In the case of latch 600, n-channel transistor 640, n-channel transistor 650, and n-channel transistor 660 are provided in place of p-channel transistor 540, p-channel transistor 550, and p-channel transistor 560, respectively. In addition, power supply voltage 575 is replaced with ground 675. Thus, when the data signal is low and the inverted data signal is high, n-channel transistor 650 is off and n-channel transistor 660 is on. Conversely, when the data signal is high and the inverted data signal is low, n-channel transistor 650 is on and n-channel transistor 660 is off. Additionally, when the clock signal is low, n-channel transistor 640 is turned on. Conversely, when the clock signal is high, n-channel transistor 640 is turned off. In this manner, the clock signal and the data signals select when either storage input 665 or storage input 670 is connected to ground 675. When storage input 665 is connected to ground 675, the input to inverter 680 is pulled down. Conversely, when storage input 670 is connected to ground 675, the input to inverter 685 is pulled down. Thus, storage portion 620 indirectly receives the data signal and the inverted data signal. In addition, storage portion 620 stores and provides the data signal and the inverted data signal as previously described with reference to latch 300.

Finally, latch 600 properly passes the asserted data signals because n-channel transistors pass Vss well. Thus, the use of differential data signals ensures the passage of a strong Vss signal to storage portion 620, rather than the strong Vcc signal passed in latch 300.

Although contention remains in the storage portion of latch 600, n-channel transistors are faster than p-channel transistors of a similar size. As a result, contention is lower in this sixth embodiment as compared to the fifth embodiment.

Figure 7:
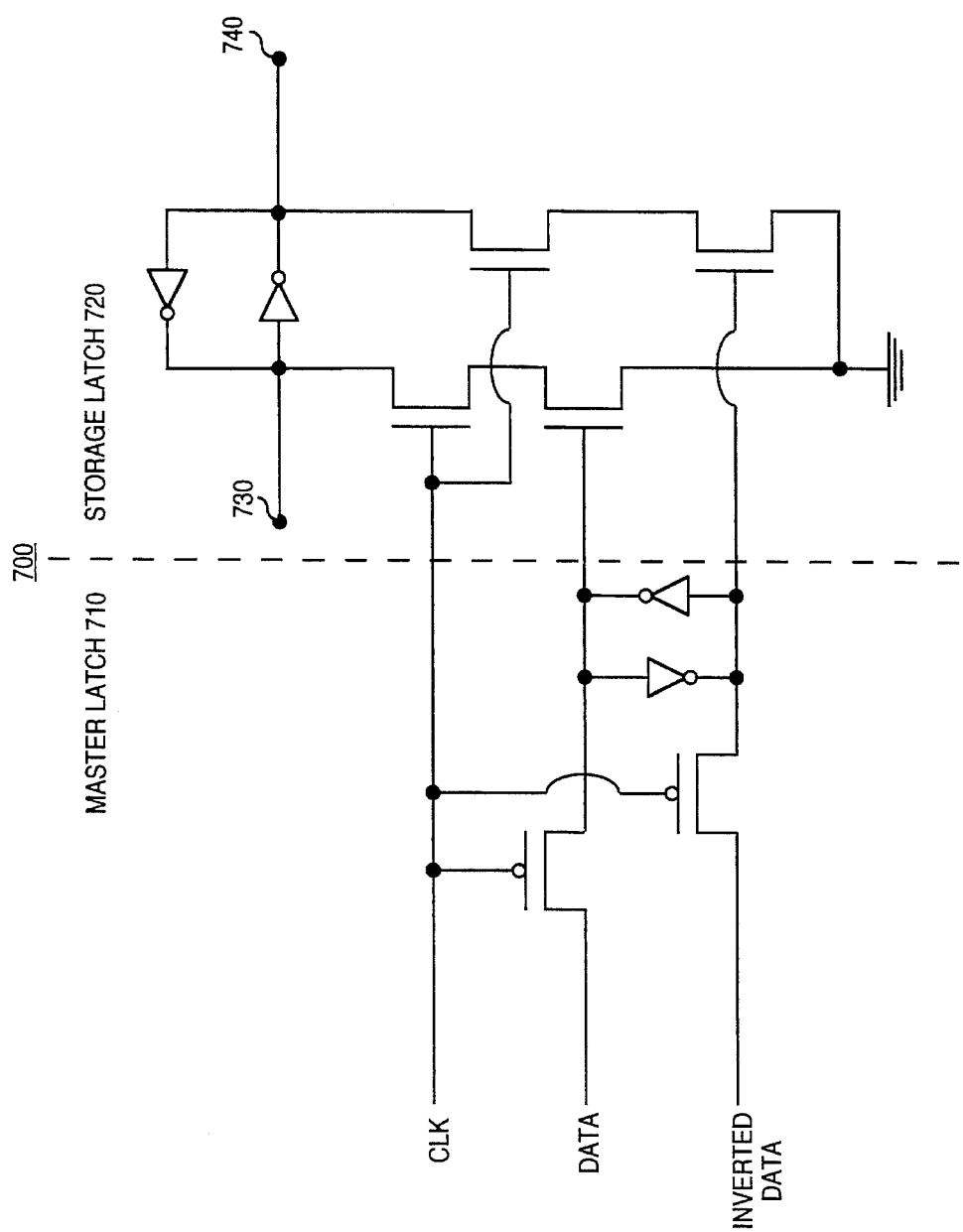
FIG. 7 is a schematic diagram of a master-slave flip-flop according to the present invention.
Figure 8:
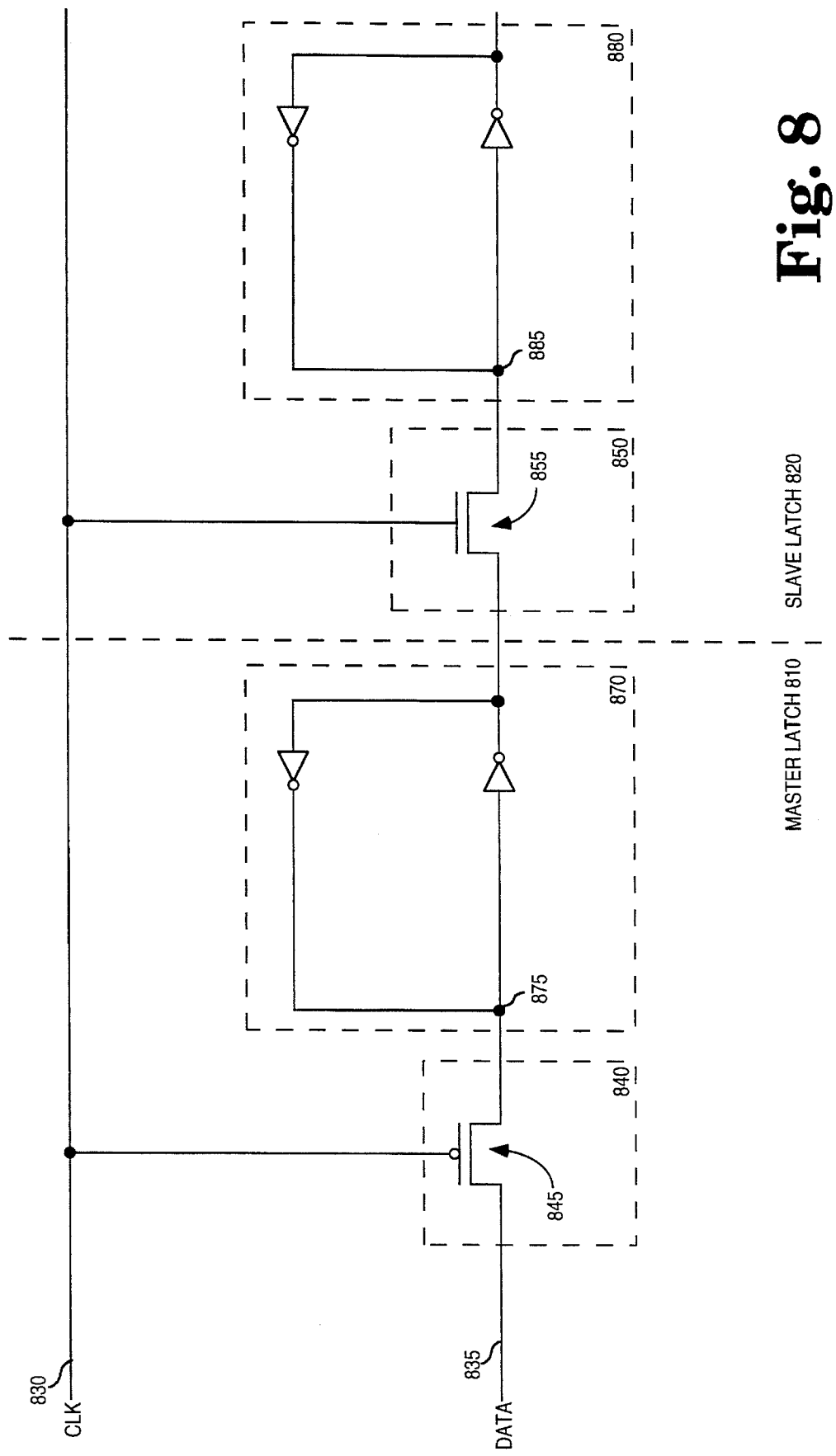
FIG. 8 is a schematic diagram of a prior art method for providing a master-slave flip-flop.
Figure 9:
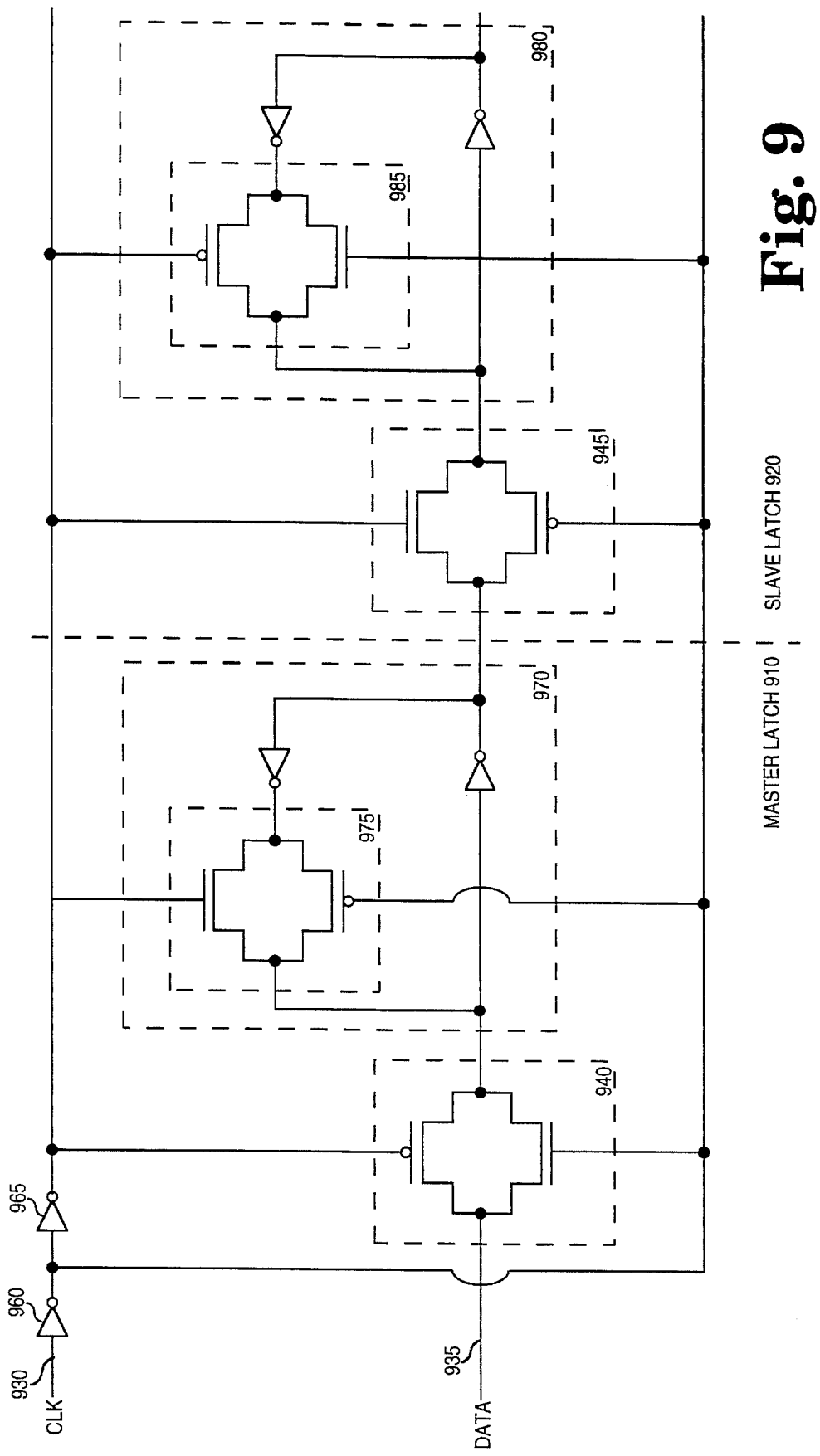
FIG. 9 is a schematic diagram illustrating a second prior art method for providing a master-slave flip-flop.

Preferred Embodiment of a Master-Slave Flip-Flop Utilizing the Present Invention FIG. 7 is a schematic diagram of a master-slave flip-flop utilizing the present invention. With reference to FIG. 7, the master-slave flip-flop 700 is comprised of a master latch 710 and a slave latch 720. Master latch 710 is the differential data latch illustrated in FIG. 1, and slave latch 720 is the differential data latch illustrated in FIG. 4. FIG. 7 also shows that slave latch 720 has a storage output 730 and a storage output 740 for providing the differential outputs of master-slave flip-flop 700. Thus, a master-slave flip-flop is provided which places very little capacitance on the clock line, thereby reducing the power dissipation of the clock line and the clock skew.

While one arrangement of differential latch circuits forming a master-slave flip-flop is described, any combination of differential data latches may be used to form a master-slave flip-flop with the inclusion of the necessary circuitry. Additionally, a differential data latch may be combined with a latch of the prior art to form a master-slave flip-flop. Thus, while certain data latches have been described with reference to use as either a master latch or a slave latch, any of these data latches could be used as a master latch and/or as a slave latch.

Alternative Embodiments

While the above descriptions discuss one mechanism for providing the storage portion of a differential latch circuit, alternative mechanisms may be utilized. While specific embodiments of the present invention have been described, various modifications and substitutions will become apparent to one skilled in the art by this disclosure. Such modifications and substitutions are within the scope of the present invention, and are intended to be covered by the following claims.

Thus what has been disclosed is a differential data latch with a low capacitance on the clock line, and thus may be used in master-slave flip-flops to reduce clock skew and power dissipation.

What is claimed is:

1. A master slave flip-flop comprising:
   a master circuit having:
     a first and second transistors each having a first terminal, a gate terminal coupled to receive a single phase clock signal, and a second terminal, said first terminals of said first and second transistors coupled to receive a data signal and an inversion of said data signal; and
     a first and second inverter each having an output terminal coupled to an input terminal of the other of said first and second inverters, said input terminals of said first and second inverters coupled respectively to said second terminal of said first and second transistors; and
   a slave circuit having:
     a third and fourth transistors each having a first terminal coupled to receive a voltage, a gate terminal, and a second terminal, said gate terminals of said third and fourth transistors coupled respectively said output terminal of said first and second inverters;
     a fifth and sixth transistor each having a first terminal, a gate terminal coupled to receive said single phase clock signal, and a second terminal, said first terminals of said fifth and sixth transistor coupled respectively to said second terminal of said third and fourth transistors; and
     a third and fourth inverter each having an output terminal coupled to an input terminal of the other of said third and fourth inverters, said input terminals of said third and fourth inverters coupled respectively to said second terminal of said fifth and sixth transistors.

2. The master slave flip-flop of claim 1, wherein:
   said first and second transistors are of a p-channel type;
   said third and fourth transistors and said fifth and sixth transistors are of a n-channel type; and
   said voltage is ground.

3. The master slave flip-flop of claim 1, wherein:
   said first and second transistors are of a n-channel type;
   said third and fourth transistors and said fifth and sixth transistors are of a p-channel type; and
   said voltage is Vcc.

4. A master slave flip-flop comprising:
   a master circuit including:
     a first and second transistors each having a first terminal coupled to receive a voltage, a gate terminal, and a second terminal, said gate terminals of said first and second transistors coupled respectively to receive a data signal and an inversion of said data signal;
     a third and fourth transistors each having a first terminal, a gate terminal coupled to receive a single phase clock signal, and a second terminal, said first terminals of said third and fourth transistors coupled respectively to said second terminal of said first and second transistors;
     a first and second inverter each having an output terminal coupled to an input terminal of the other of said first and second inverters, said input terminals of said first and second inverters coupled respectively to said second terminal of said third and fourth transistors; and
   a slave circuit including:
     a fifth and sixth transistors each having a first terminal, a gate terminal coupled to receive said single phase clock signal, and a second terminal, said first terminals of said fifth and sixth transistors coupled said output terminal of said first and second inverters; and
     a third and fourth inverter each having an output terminal coupled to an input terminal of the other of said third and fourth inverters, said input terminals of said third and fourth inverters coupled respectively to said second terminal of said fifth and sixth transistors.

5. The master slave flip-flop of claim 4, wherein:
   said first and second transistors and said third and fourth transistors are of a p-channel type;
   said fifth and sixth transistors are of n-channel type; and
   said voltage is Vcc.

6. The master slave flip-flop of claim 4, wherein:
   said first and second transistors and said third and fourth transistors are of a n-channel type;
   said fifth and sixth transistors are of a p-channel type; and
   said voltage is ground.

7. A master slave flip-flop comprising:
   a master circuit including:
     a first and second transistors each having a first terminal, a gate terminal coupled to receive a single phase clock signal, and a second terminal, said first terminals of said first and second transistors coupled respectively to receive a data signal and an inversion of said data signal;
     a first and second inverter each having an output terminal coupled to an input terminal of the other of said first and second inverters, said input terminals of said first and second inverters coupled respectively to said second terminal of said first and second transistors; and
   a slave circuit including:
     a third transistor having a first terminal coupled to receive a voltage, a gate terminal coupled to receive said single phase clock signal, and a second terminal;
     a fourth and fifth transistors each having a first terminal coupled to said second terminal of said third transistor, a gate terminal, and a second terminal, said gate terminals of said fourth and fifth transistors coupled respectively to said output terminal of said first and second inverters; and
     a third and fourth inverter each having an output terminal coupled to an input terminal of the other of said third and fourth inverters, said input terminals of said third and fourth inverters coupled respectively to said second terminal of said fourth and fifth transistors.

8. The master slave flip-flop of claim 7, wherein:
   said first and second transistors arc of a p-channel type;
   said third transistor and said fourth and fifth transistors arc of n-channel type; and
   said voltage is ground.

9. The master slave flip-flop of claim 7, wherein:
   said first and second transistors are of a n-channel type;
   said third transistor and said fourth and fifth transistors arc of a p-channel type; and said voltage is Vcc.

10. A master slave flip-flop comprising:

a master circuit including:
- a first transistor having a first terminal coupled to receive a voltage, a gate terminal coupled to receive a single phase clock signal, and a second terminal;
- a second and third transistors each having a first terminal coupled to said second terminal of said first transistor, a gate terminal, and a second terminal, said gate terminals of said second and third transistors coupled respectively to receive a data signal and an inversion of said data signal; and
- a first and second inverter each having an output terminal coupled to an input terminal of the other of said first and second inverters, said input terminals of said first and second inverters coupled respectively to said second terminal of said second and third transistors; and a slave circuit including:
- a fourth and fifth transistors each having a first terminal, a gate terminal coupled to receive said single phase clock signal, and a second terminal, said first terminals of said fourth and fifth transistors coupled respectively to said output terminal of said first and second inverters; and
- a third and fourth inverter each having an output terminal coupled to an input terminal of the other of said third and fourth inverters, said input terminals of said third and fourth inverters coupled respectively to said second terminal of said fourth and fifth transistors.

11. The master slave flip-flop of claim 10, wherein:

said first transistor and said third and fourth transistors and are of a p-channel type;

said fourth and fifth transistors are of a n-channel type; and said voltage is Vcc.

12. The master slave flip-flop of claim 10, wherein:

said first transistor and said third and fourth transistors and are of a n-channel type;

said fourth and fifth transistors are of a p-channel type; and said voltage is ground.

* * * * *

UNITED STATES PATENT AND TRADEMARK OFFICE
CERTIFICATE OF CORRECTION

| | | |
|---|---|---|
| PATENT NO. | : | 5,508,648 |
| DATED | : | April 16, 1996 |
| INVENTOR(S) | : | Jashojiban Banik |

It is certified that error appears in the above-identified patent and that said Letters Patent is hereby corrected as shown below:

In column 4 at line 11 insert --the-- following "both" and prior to "output"

In column 5 at line 41 delete "tem-final" and insert --terminal--

In column 6 at line 29 insert --transistors-- following "P-channel" and prior to "pass"

In column 7 at line 61 delete "tip." and insert --up.--

Signed and Sealed this

Thirty-first Day of December, 1996

*Attest:*

BRUCE LEHMAN

*Attesting Officer*     Commissioner of Patents and Trademarks